US006768132B2

(12) United States Patent
Smith et al.

(10) Patent No.: US 6,768,132 B2
(45) Date of Patent: Jul. 27, 2004

(54) SURFACE MODIFIED ORGANIC THIN FILM TRANSISTORS

(75) Inventors: Terrance P. Smith, Woodbury, MN (US); Mark J. Pellerite, Woodbury, MN (US); Tommie W. Kelley, Coon Rapids, MN (US); Dawn V. Muyres, St. Paul, MN (US); Dennis E. Vogel, Lake Elmo, MN (US); Kim M. Vogel, Lake Elmo, MN (US); Larry D. Boardman, Woodbury, MN (US); Timothy D. Dunbar, Woodbury, MN (US)

(73) Assignee: 3M Innovative Properties Company, Saint Paul, MN (US)

( * ) Notice: Subject to any disclaimer, the term of this patent is extended or adjusted under 35 U.S.C. 154(b) by 119 days.

(21) Appl. No.: 10/094,007

(22) Filed: Mar. 7, 2002

(65) Prior Publication Data

US 2003/0175551 A1 Sep. 18, 2003

(51) Int. Cl.$^7$ .............................................. H01L 51/00

(52) U.S. Cl. ........................ 257/40; 257/410; 257/411; 438/99; 428/901

(58) Field of Search .......................... 257/40, 410, 411; 438/99, 151, 158, 287, 904; 428/201, 209, 411.1, 901

(56) References Cited

U.S. PATENT DOCUMENTS

| | | | |
|---|---|---|---|
| 4,363,859 A | 12/1982 | Sasaki et al. .................. | 430/59 |
| 4,539,061 A | 9/1985 | Sagiv .......................... | 156/278 |
| 4,981,962 A | 1/1991 | Baumann et al. ............... | 540/1 |
| 5,079,179 A | 1/1992 | Josefowicz et al. ........... | 437/41 |
| 5,347,144 A | 9/1994 | Garnier et al. ................. | 257/40 |
| 5,625,199 A | 4/1997 | Baumbach et al. ............ | 257/40 |
| 5,965,679 A | 10/1999 | Godschalx et al. ......... | 526/281 |
| 6,232,157 B1 | 5/2001 | Dodabalapur et al. ....... | 438/158 |
| 6,252,245 B1 | 6/2001 | Katz et al. .................... | 257/40 |
| 6,265,243 B1 | 7/2001 | Katz et al. ..................... | 438/99 |
| 6,288,188 B1 | 9/2001 | Godschalx et al. ......... | 526/285 |
| 6,326,640 B1 | 12/2001 | Shi et al. ...................... | 257/40 |
| 6,433,359 B1 * | 8/2002 | Kelley et al. .................. | 257/40 |
| 2003/0097010 A1 * | 5/2003 | Vogel et al. ................. | 552/208 |

FOREIGN PATENT DOCUMENTS

| | | |
|---|---|---|
| DE | 198 15 220 A1 | 9/1999 |
| EP | 0 344 111 A2 | 11/1989 |
| EP | 1 041 652 A2 | 10/2000 |
| GB | 680343 | 10/1952 |
| JP | 11-354277 | 12/1999 |
| WO | WO 99/66540 | 12/1999 |
| WO | WO 01/01502 A2 | 1/2001 |

OTHER PUBLICATIONS

Song, Chung–Kun, "Effects of Hydrophobic Treatment on the Performance of Pentacene TFT", KIEE International Transactions on EA, (2002)m pp. 136–138, vol. 12C–2, no month.

Gundlach et al., "Pentacene Organic Thin–Film Transistors—Molecular Ordering and Mobility", *IEEE Electron Device Letters*, vol. 18, No. 3, Mar. 1997, pp. 87–90.

Lin et al., "Pentacene–Based Organic Thin Film Transistors", *IEEE Transactions on Electron Devices*, vol. 44, No. 8, Aug. 1997, pp. 1325–1331.

Lin et al., "Stacked Pentacene Layer Organic Thin–Film Transistors with Improved Characteristics", *IEEE Electron Device Letters*, vol. 18, No. 12, Dec. 1997, pp. 606–608.

Drury et al., "Low–cost all–polymer integrated circuits", *Applied Physics Letters*, vol. 73, No. 1, Jul. 1998, pp. 108–110.

Klauk et al., "Pentacene Organic Thin–Film Transistors for Circuit and Display Applications", *IEEE Transactions on Electron Devices*, vol. 46, No. 6, Jun. 1999, pp. 1258–1263.

Gundlach et al., "High–Mobility, Low Voltage Organic Thin Film Transistors", 1999 International Electron Devices Meeting Technical Digest, Dec. 1999, pp. 111–114.

Bao, "Materials and Fabrication Needs for Low–Cost Organic Transistor Circuits", *Advanced Materials*, 2000, page numbers not provided, no month.

Martin et al., "Development of a Low–Dielectric–Constant Polymer for the Fabrication of Integrated Circuit Interconnect", *Adv. Mater.* 12 (23), Dec. 2000, pp. 1769–1778.

Tate et al., "Anodization and Microcontact Printing on Electroless Silver: Solution–Based Fabrication Procedures for Low–Voltage Electronic Systems with Organic Active Components", *Langmuir*, 16, 2000, pp. 6054–6060, published on Web Jun. 14, 2000.

Crone et al., "Large–scale complementary integrated circuits based on organic transistors", *Nature*, vol. 403, Feb. 2000, pp. 521–523.

Klauk et al., "Pentacene organic thin–film transistors and ICs", *Solid State Technology*, Mar. 2000, pp. 63–64, 66–67, 72, 75 and 77.

(List continued on next page.)

*Primary Examiner*—Marie Yamnitzky
(74) *Attorney, Agent, or Firm*—Kent S. Kokko

(57) ABSTRACT

An organic thin film transistor comprising a self-assembled monolayer interposed between a gate dielectric and an organic semiconductor layer. The monolayer is a product of a reaction between the gate dielectric and a precursor to the self-assembled monolayer. The semiconductor layer comprises a material selected from an acene, substituted with at least one electron-donating group, halogen atom, or a combination thereof, or a benzo-annellated acene or polybenzo-annellated acene, which optionally is substituted with at least one electron-donating group, halogen atom, or a combination thereof. Methods of making a thin film transistor and an integrated circuit comprising thin film transistors.

28 Claims, No Drawings

OTHER PUBLICATIONS

Klauk et al., "A reduced complexity process for organic thin film transistors", *Applied Physics Letters*, vol. 76, No. 13, Mar. 2000, pp. 1692–1693.

Rogers et al., "Organic Smart Pixels and Complementary Inverter Circuits Formed on Plastic Substrates by Casting and Rubber Stamping", *IEEE Electron Devices Letters*, vol. 21, No. 3, Mar. 2000, pp. 100–103.

Kane et al., "Analog and Digital. Circuits Using Organic Thin–Film Transistors on Polyester Substrates", *IEEE Electron Device Letters*, vol. 21, No. 11, Nov. 2000, pp. 534–536.

Gundlach et al., "Improved Organic Thin Film Transistor Performance Using Chemically–Modified Gate Dielectrics", Proc. SPIE, vol. 4466, 2001, pp. 54–64, no month.

Marshall, "Welcome to Plastic Valley", *Business 2.0*, Jan. 2001, 3 pages.

Meyer zu Heringdorf et al., "Growth dynamics of pentacene thin films", *Nature*, vol. 412, Aug. 2001, pp. 517–520.

Swiggers et al., "Orientation of pentacene films using surface alignment layers and its influence on thin–film transistor characteristics", *Applied Physics Letters*, vol. 79, No. 9, Aug. 2001, pp. 1300–1302.

Kagan et al., "Patterning organ–inorganic thin–film transistors using microcontact printed templates", Applied Physics Letters, vol. 79, No. 21, Nov. 2001, pp. 3536–3538.

Katz et al., "Organic Field–Effect Transistors With Polarizable Gate Insulators", Journal of Applied Physics, vol. 91, No. 3, Feb. 2002, pp. 1572–1576.

Sita, "Convenient Highly Stereoselective Syntheses of (3R, 7R,11R)– and (3S,7R,11R)–3,7,11,15–Tetramethylhexadecanoic Acid (Phytanic Acid) and the Corresponding 3,7,11, 15–Tetramethylhexadecan–1–ols", *J. Org. Chem.*, 58, 1993, pp. 5285–5287, no month.

Gao et al., "Self–Assembled Monolayers of Alkylphosphonic Acids on Metal Oxides", *Langmuir*, 12, 1996, pp. 6429–6435, no month.

Collet et al., "Performances of Sexithiophene Based Thin–Film Transistor Using Self–Assembled Monolayers", *Mat. Res. Soc. Symp. Proc.*, vol. 488, 1998, pp. 407–412, no month.

Goetting et al., "Microcontact Printing of Alkanephosphonic Acids on Aluminium: Pattern Transfer by Wet Chemical Etching", *Langmuir*, 15, 1999, pp. 1182–1191, no month.

Kosbar et al., "The Effect of Surface Preparation on the Structure and Electrical Transport in an Organic Semiconductor", *Mat. Res. Soc. Symp. Proc.*, vol. 665, 2001, pp. C10.6.1–C10.6.6, no month.

Koide et al., "Patterned Luminescence of Organic Light-Emitting Diodes by Hot Microcontact Printing (H$\mu$CP) of Self–Assembled Monolayers", *J. Am. Chem. Soc.*, 122, 2000, pp. 11266–11267, published on Web Oct. 27, 2000.

Braach–Maksvytis et al., "Highly Impermeable "Soft" Self–Assembled Monolayers", *J. Am. Chem. Soc.*, 112, 2000, pp. 9544–9545, published on Web Sep. 19, 2000.

\* cited by examiner

SURFACE MODIFIED ORGANIC THIN FILM TRANSISTORS

TECHNICAL FIELD

This invention relates to organic thin film transistors having improved performance. More particularly, the invention relates to organic thin film transistors having a substituted acene semiconductor and a self-assembled monolayer between the semiconductor and gate dielectric.

BACKGROUND

Organic semiconductors are of great interest for a variety of applications such as low-cost electronics. Organics can be synthesized to incorporate the necessary electronic properties for a wide variety of devices, and also can be constructed to allow low-cost, roll processing that is not currently possible for crystalline silicon microelectronics.

One area of concern in organic electronic devices is the quality of the interface formed between the organic semiconductor and another device layer. Previous efforts to control the semiconductor/dielectric interface have included the use of hexamethyldisilazane (HMDS) and silane coupling agents on silicon oxide surfaces. Complex deposition processes involving long times in a vacuum have been used to coat octadecyltrichlorosilane (OTS) onto thermally-grown silicon dioxide gate dielectric materials to affect transistor performance. The materials useful in this process have several disadvantages, including sensitivity to water in the atmosphere and on the surface of a dielectric layer, instability due to crosslinking within the material in competition with the bonding reaction to the dielectric layer, and difficulties in achieving reproducible film properties. EP 1041652 A2 describes the use of several surface treatments to enhance the crystalline domain size of solution cast oligothiophenes on $SiO_x$ for thin film transistors (TFTs), although measured mobility values were generally lower than the untreated controls.

SUMMARY

Briefly, the present invention provides an organic thin film transistor (OTFT) comprising a self-assembled monolayer interposed between a gate dielectric and an organic semiconductor layer, the monolayer being a product of a reaction between the gate dielectric and a precursor to the self-assembled monolayer, the precursor comprising a composition having the formula:

X—Y—$Z_n$, wherein X is H or $CH_3$;
Y is a linear or branched $C_5$–$C_{50}$ aliphatic or cyclic aliphatic connecting group, or a linear or branched $C_8$–$C_{50}$ group comprising an aromatic group and a $C_3$–$C_{44}$ aliphatic or cyclic aliphatic connecting group;
Z is selected from —$PO_3H_2$, —$OPO_3H_2$, benzotriazolyl (—$C_6H_4N_3$), benzotriazolylcarbonyloxy (—OC(=O)$C_6H_4N_3$), benzotriazolyloxy (—O—$C_6H_4N_3$), benzotriazolylamino (—NH—$C_6H_4N_3$), —CONHOH, —COOH, —OH, —SH, —COSH, —COSeH, —$C_5H_4N$, —SeH, —$SO_3H$, —NC, —SiCl($CH_3$)$_2$, —$SiCl_2CH_3$, amino, and phosphinyl; and n is 1, 2, or 3 provided that n=1 when Z is —SiCl($CH_3$)$_2$ or —$SiCl_2CH_3$; and wherein the organic semiconductor layer comprises a material selected from an acene, substituted with at least one electron-donating group, halogen atom, or a combination thereof, or a benzo-annellated acene or polybenzo-annellated acene, which optionally is substituted with at least one electron-donating group, halogen atom, or a combination thereof.

The present invention also provides an organic thin film transistor comprising a self-assembled monolayer interposed between a gate dielectric and an organic semiconductor layer, the monolayer being a product of a reaction between the gate dielectric and a precursor to the self-assembled monolayer, the precursor comprising a composition having the formula:

X—Y—$Z_n$, wherein X is H or $CH_3$;
Y is a linear or branched $C_5$–$C_{50}$ aliphatic or cyclic aliphatic connecting group, or a linear or branched $C_8$–$C_{50}$ group comprising an aromatic group and a $C_3$–$C_{44}$ aliphatic or cyclic aliphatic connecting group;
Z is selected from —$PO_3H_2$, —$OPO_3H_2$, benzotriazolyl (—$C_6H_4N_3$), benzotriazolylcarbonyloxy (—OC(=O)$C_6H_4N_3$), benzotriazolyloxy (—O—$C_6H_4N_3$), benzotriazolylamino (—NH—$C_6H_4N_3$), —CONHOH, —COOH, —OH, —SH, —COSH, —COSeH, —$C_5H_4N$, —SeH, —$SO_3H$, —NC, —SiCl($CH_3$)$_2$, —$SiCl_2CH_3$, amino, and phosphinyl;
and n is 1, 2, or 3 provided that n=1 when Z is —SiCl($CH_3$)$_2$ or —$SiCl_2CH_3$; and wherein the organic semiconductor layer comprises a semiconductor of the formula:

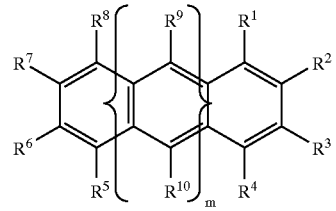

wherein each R group is independently selected from electron-donating groups, halogen atoms, hydrogen atoms, and combinations thereof, provided that not all R groups are hydrogen; m is 1, 2, 3, or 4; each $R^9$ and $R^{10}$ is independently H or any R group; and any combination of two adjacent R groups may together form a five or six carbon cyclic aliphatic or aromatic group; provided that neither $R^2$ with $R^3$ nor $R^6$ with $R^7$ form part of a six-member aromatic ring; and provided that when m is 1 neither $R^9$ nor $R^{10}$ form part of a six-member aromatic ring.

As used herein, "electron-donating group" means $C_1$–$C_{24}$ alkyl, alkoxy, thioalkoxy, or combinations thereof, which may be substituted or unsubstituted and "substituted" means, for a chemical species, substituted by a group that does not interfere with the desired product or process, e.g., substituents can be alkyl, alkoxy, aryl, phenyl, halo (F, Cl, Br, I), etc.

Various thin film transistor construction options are possible. For example, the source and drain electrodes may be adjacent to the gate dielectric with the organic semiconductor layer over the source and drain electrodes, or the organic semiconductor layer may be interposed between the source and drain electrodes and the gate dielectric.

In another aspect, the present invention provides a method of making a thin film transistor comprising the steps of providing a substrate, providing a gate electrode material on the substrate, providing a gate dielectric on the gate electrode material, providing a self-assembled monolayer (SAM) adjacent to the gate dielectric, the monolayer being a product of a reaction between the gate dielectric and a precursor to the self-assembled monolayer, applying an organic semiconductor layer on the monolayer, and providing a source electrode and a drain electrode contiguous to the organic semiconductor layer. The precursor is as described above with the organic thin film transistor article. The organic semiconductor layer also is as described above with the organic thin film transistor article. An integrated circuit comprising organic thin film transistor articles is also provided.

It is an advantage of the present invention to provide organic thin film transistors with one or more improvements over known devices that lack the features of the present invention. With the invention, improvements in properties such as threshold voltage, subthreshold slope, on/off ratio, and charge-carrier mobility can be achieved. The improvements in device performance provided by the present invention enable the production of more complicated circuits having faster switching speeds and simpler processing conditions. This invention also enables the production of larger circuit elements having comparable performance to devices with very small features. Devices with larger feature sizes can be less expensive as they do not require expensive precision patterning processes.

Other features and advantages of the invention will be apparent from the following detailed description of the invention and the claims. The above summary of principles of the disclosure is not intended to describe each illustrated embodiment or every implementation of the present disclosure. The following detailed description more particularly exemplifies certain preferred embodiments utilizing the principles disclosed herein.

DETAILED DESCRIPTION

Generally, a thin film transistor includes a gate electrode, a gate dielectric on the gate electrode, a source electrode and a drain electrode adjacent to the gate dielectric, and a semiconductor layer adjacent to the gate dielectric and adjacent to the source and drain electrodes. More specifically, an organic thin film transistor (OTFT) has an organic semiconductor layer. Such OTFTs are known in the art as shown, for example, in copending application U.S. Ser. No. 09/947,845, Attorney Docket No. 56999US002, filed on Sep. 6, 2001, now U.S. Pat. No. 6,433,359, which is herein incorporated by reference.

The organic thin film transistor of the present invention further includes a self-assembled monolayer (SAM) interposed between the gate dielectric and the organic semiconductor layer, and wherein the organic semiconductor comprises a substituted acene.

Substrate

A substrate can be used to support the OTFT, e.g., during manufacturing, testing, storage, use, or any combination thereof. The gate electrode and/or gate dielectric may provide sufficient support for the intended use of the resultant OTFT such that another substrate is not required. For example, doped silicon can function as the gate electrode and support the OTFT. In another example, one substrate may be selected for testing or screening various embodiments while another substrate is selected for commercial embodiments. In another embodiment, a support may be detachably adhered or mechanically affixed to a substrate, such as when the support is desired for a temporary purpose. For example, a flexible polymeric substrate may be adhered to a rigid glass support, which support could be removed. In some embodiments, the substrate does not provide any necessary electrical function for the OTFT. This type of substrate is termed a "non-participating substrate" in this document.

Useful substrate materials can include organic and/or inorganic materials. For example, the substrate may comprise inorganic glasses, ceramic foils, polymeric materials, filled polymeric materials, coated metallic foils, acrylics, epoxies, polyamides, polycarbonates, polyimides, polyketones, poly(oxy-1,4-phenyleneoxy-1,4-phenylenecarbonyl-1,4-phenylene)(sometimes referred to as poly(ether ether ketone) or PEEK), polynorbornenes, polyphenyleneoxides, poly(ethylene naphthalenedicarboxylate) (PEN), poly(ethylene terephthalate) (PET), poly(phenylene sulfide) (PPS), and fiber-reinforced plastics (FRP), and combinations thereof.

A flexible substrate is used in some embodiments of the present invention. This allows for roll processing, which may be continuous, providing economy of scale and economy of manufacturing over flat and/or rigid substrates. The flexible substrate chosen preferably is capable of wrapping around the circumference of a cylinder of less than about 50 cm diameter without distorting or breaking. The substrate chosen more preferably is capable of wrapping around the circumference of a cylinder of less than about 25 cm diameter without distorting or breaking the substrate. In some embodiments, the substrate chosen most preferably is capable of wrapping around the circumference of a cylinder of less than about 10 cm diameter, or even about 5 cm diameter, without distorting or breaking the substrate. The force used to wrap the flexible substrate of the invention around a particular cylinder typically is low, such as by unassisted hand, i.e., without the aid of levers, machines, hydraulics, and the like. The flexible substrate may be rolled upon itself.

Gate Electrode

The gate electrode can be any useful conductive material. For example, the gate electrode may comprise doped silicon, or a metal, such as aluminum, chromium, copper, gold, silver, nickel, palladium, platinum, tantalum, and titanium. Conductive polymers also can be used, for example polyaniline, poly(3,4-ethylenedioxythiophene)/poly(styrene sulfonate) (PEDOT:PSS). In addition, alloys, combinations, and multilayers of these materials may be useful.

In some embodiments of the invention, the same material can provide the gate electrode function and also provide the support function of the substrate. For example, doped silicon can function as the gate electrode and support the OTFT.

Gate Dielectric

The gate dielectric is provided on the gate electrode, for example, through a deposition process. This gate dielectric electrically insulates the gate electrode under the operating conditions of the OTFT device from the balance of the device. Thus, the gate dielectric comprises an electrically insulating material. The gate dielectric should have a dielectric constant above about 2, more preferably above about 5. The dielectric constant of the gate dielectric also can be very high, for example, 80 to 100 or even higher. Useful materials for the gate dielectric may comprise, for example, an organic or inorganic electrically insulating material, or combinations thereof.

The gate dielectric may comprise a polymeric material, such as polyvinylidenefluoride (PVDF), cyanocelluloses, polyimides, epoxies, etc. In some embodiments, an inorganic capping layer comprises the outer layer of an otherwise polymeric gate dielectric.

Some specific examples of inorganic materials useful for the gate dielectric include strontiates, tantalates, titanates, zirconates, aluminum oxides, silicon oxides, tantalum oxides, titanium oxides, silicon nitrides, barium titanate, barium strontium titanate, barium zirconate titanate, zinc selenide, and zinc sulfide. In addition, alloys, combinations, and multilayers of these can be used for the gate dielectric. Of these materials, aluminum oxides, silicon oxides, silicon nitrides, and zinc selenide are preferred.

The gate dielectric can be deposited in the OTFT as a separate layer, or formed on the gate such as by oxidizing, including anodizing, the gate material to form the gate dielectric.

Source and Drain Electrodes

The source electrode and drain electrode are separated from the gate electrode by the gate dielectric, while the organic semiconductor layer can be over or under the source electrode and drain electrode. The source and drain electrodes can be any useful conductive material. Useful materials include those described above for the gate electrode as well as barium and calcium.

The thin film electrodes (e.g., gate electrode, source electrode, and drain electrode) can be provided by any useful means such as physical vapor deposition (e.g., thermal evaporation, sputtering) or ink jet printing. The patterning of these electrodes can be accomplished by known methods such as shadow masking, additive photolithography, subtractive photolithography, printing, microcontact printing, and pattern coating.

Organic Semiconductors

In an embodiment of the present invention, the organic semiconductor layer comprises a material selected from an acene, substituted with at least one electron-donating group, halogen atom, or a combination thereof, or a benzo-annellated acene or polybenzo-annellated acene, which optionally is substituted with at least one electron-donating group, halogen atom, or a combination thereof. The electron-donating group is selected from an alkyl, alkoxy, or thioalkoxy group having from 1 to 24 carbon atoms.

In another embodiment of the present invention, the organic semiconductor layer comprises a semiconductor of the formula:

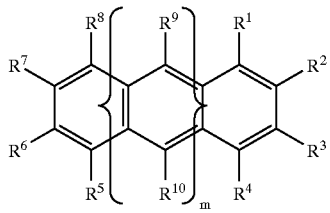

wherein each R group is independently selected from electron-donating groups, halogen atoms, hydrogen atoms, and combinations thereof, provided that not all R groups are hydrogen; m is 1, 2, 3, or 4; each $R^9$ and $R^{10}$ is independently H or any R group; and any combination of two adjacent R groups may together form a five or six carbon cyclic aliphatic or aromatic group; provided that neither $R^2$ with $R^3$ nor $R^6$ with $R^7$ form part of a six-member aromatic ring; and provided that when m is 1 neither $R^9$ nor $R^{10}$ form part of a six-member aromatic ring.

Alkyl- or polyalkyl-substituted acenes are preferred classes of organic semiconductor materials that are useful in this invention. As used herein, "polyalkyl", and "polyalkoxy", and "polybenzo" mean more than one alkyl, alkoxy, or benzo group.

Non-limiting examples of benzo-annellated and polybenzo-annellated acenes include 1,2-benzanthracene (benz[a]anthracene or tetraphene), 1,2:3,4-dibenzanthracene (dibenz[a,c]anthracene), 1,2:5,6-dibenzanthracene (dibenz[a,h]anthracene), 1,2:7,8-dibenzanthracene (dibenz[a,j]anthracene), 1,2:3,4:5,6-tribenzanthracene (tribenz[a,c,h]anthracene), 1,2:3,4:5,6:7,8-tetrabenzanthracene (tetrabenz[a,c,h,j]anthracene, 1,2-benzotetracene (benzo[a]naphthacene), 1,2:3,4-dibenzotetracene (dibenzo[a,c]naphthacene), 1,2:7,8-dibenzotetracene (dibenzo[a,j]naphthacene), 1,2:9,10-dibenzotetracene (dibenzo[a,l]naphthacene), 1,2:3,4:7,8-tribenzotetracene (tribenzo[a,c,j]naphthacene), 1,2:3,4:7,8:9,10-tetrabenzotetracene (tetrabenzo[a,c,j,l]naphthacene), 1,2-benzopentacene (benzo[a]pentacene), 1,2:3,4-dibenzopentacene (dibenzo[a,c]pentacene), 1,2:8,9-dibenzopentacene (dibenzo [a,l]pentacene), 1,2:10,11-dibenzopentacene (dibenzo[a,n]pentacene), 1,2:3,4:8,9:10,11-tetrabenzopentacene (tetrabenzo[a,c,l,n]pentacene, 1,2-benzohexacene (benzo[a]hexacene), and substituted derivatives thereof. Further examples include benzoacenes with the benzo group attached to two rings of the acene, such as dibenzo[de,qr]tetracene (dibenzo[de,qr]naphthacene or naphtho[2,3-e]pyrene), zethrene (dibenzo[de,mn]naphthacene), dibenzo[de,st]pentacene, and dibenzo[de,uv]pentacene. In the preceding list, the common name is given followed by alternative names or Chemical Abstracts Service (CAS) names in parentheses.

Such acenes may be substituted, such as with at least one alkyl group. Preferred but non-limiting examples of alkyl groups are methyl, ethyl, n-propyl, isopropyl, n-butyl, sec-butyl, n-pentyl, n-hexyl, n-heptyl, 2-methylhexyl, 2-ethylhexyl, n-octyl, n-nonyl, n-decyl, n-dodecyl, n-octadecyl, and 3,5,5-trimethylhexyl.

Examples of alkyl-substituted acenes useful in the present invention include but are not limited to the following: 1-methylanthracene, 2-methylanthracene, 1,2-dimethylanthracene, 2,3-dimethylanthracene, 2,3,6,7-tetramethylanthracene, 1,2,3,4-tetramethylanthracene, 2-ethylanthracene, 2,6-diethylanthracene, 2-hexylanthracene, 2,6-dihexylanthracene, 1-methyltetracene, 2-methyltetracene, 2,3-dimethyltetracene, 2,8-dimethyltetracene, 2,3,9,10-tetramethylpentacene, 2-ethyltetracene, 2,8-diethylpentacene, 2,9-diethylpentacene, 2-hexyltetracene, 2-nonyltetracene, 1-methylpentacene, 2-methylpentacene, 2,3-dialkylpentacenes, 2,9-dialkylpentacenes, and 2,10-dialkylpentacenes (e.g., 2,3-dimethylpentacene, 2,9-dimethylpentacene, 2,10-dimethylpentacene), 2-ethylpentacene, 2,10-dialkoxypentacenes, 2,3,9,10-tetraalkylpentacenes, 1,4,8,11-tetraalkoxypentacenes, and 1,2,3,4,8,9,10,11-octaalkylpentacene, wherein the alkyl or alkoxy group in each of the formulas above has from 1 to 24 carbons. Preferred dialkyl acenes include 2,6-dialkylanthracene, 2,8-dialkyltetracene, and 2,9-dialkylpentacene.

Alkyl-substituted acenes can be prepared by any known method. For example, various methyl-substituted anthracenes are taught in Table XXIV in E. Clar, Polycyclic Hydrocarbons, Volume 1, Academic Press (London and New York) and Springer-Verlag (Berlin, Gottingen and Heidelberg), 1964, pages 298–299. Other alkylanthracenes can be prepared by similar methods as described in Table XXIV of the same reference, which is herein incorporated by reference.

Substituted tetracenes also can be prepared by any known method, including for example, the following sequence of reactions: 1) the condensation of naphthalene-2,3-dicarboxylic anhydride and benzene derivatives, 2) dehydration to form the corresponding tetracene-5,12-quinone, 3) and reduction of the quinone to give the corresponding tetracene derivative. Such methods are taught, e.g., in Waldmann, H. and Mathiowetz, H., Ber. dtsch. Chem. Ges. 64, 1713 (1931), Weizmann, C., Haskelberg, L. and Berlin, T., J. Chem. Soc. 398 (1939); Waldemann, H. and Plak, G., J. prakt. Chem. (2) 150, 113, 121 (1938), which are herein incorporated by reference. Other examples of synthesis of alkyl homologues of tetracene include: 2-methyltetracene (Coulson, E. A., J. Chem. Soc. 1406 (1934)), 5-methyltetracene (Clar, E. and Wright, J. W., Nature, Lond. 63, 921 (1949)), 2-isopropyltetracene (Cook, J. W., J. Chem. Soc. 1412 (1934)), 1,6-dimethyltetracene (Fieser, L. F. and Hershberg, E. B. J. Amer. Chem. Soc. 62, 49 (1940)), 2,8-dimethyltetracene (Fieser, L. F. and Hershberg, E. B. J. Amer. Chem. Soc. 62, 49 (1940) and Coulson, E. A., J. Chem. Soc. 1406 (1934)), 2,9-dimethyltetracene (Coulson, E. A., J. Chem. Soc. 1406 (1934)), and 5,12-dimethyltetracene (Wolf, J., J. Chem. Soc. 75, 2673 (1953)), which are herein incorporated by reference.

Substituted pentacene compounds that are useful as organic semiconductors in the present invention include compounds comprising at least one substituent selected from the group consisting of electron-donating substituents (e.g., alkyl, alkoxy, thioalkoxy), halogen substituents, and combinations thereof. Useful substituted pentacenes include but are not limited to 2,9-dialkylpentacenes and 2,10-dialkylpentacenes, 2,10-dialkoxypentacenes, 2,3,9,10-tetraalkylpentacenes, and 1,4,8,11-tetraalkoxypentacenes, wherein each alkyl or alkoxy group in the preceding formulas has from 1 to 24 carbons. Such substituted pentacenes are taught in copending applications U.S. Ser. No. 09/966,954, Attorney Docket No. 57087US002, and U.S. Ser. No. 09/966,961, Attorney Docket No. 57088US002, both filed on Sep. 27, 2001, both now abandoned, which are herein incorporated by reference.

Further details of benzo-annellated and polybenzo-annellated acenes can be found in the art, for example, in NIST Special Publication 922 "Polycyclic Aromatic Hydrocarbon Structure Index", U.S. Govt. Printing Office, by Sander and Wise (1997).

As used herein, the numbering sequence that is used for pentacene is exemplified with the structure shown below.

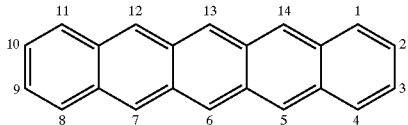

The location of a substituent on such a compound is commonly specified by reference to the number of the carbon atom to which the substituent is bonded. There is one hydrogen atom bonded to each numbered carbon atom if no substituent is indicated.

Substituted pentacene semiconductors useful in the present invention can be prepared by a process comprising the steps of (1) combining at least one substituted benzene (more specifically, at least one mono-, di-, tri-, or tetrasubstituted benzene having at least two adjacent ring carbon atoms that are bonded to hydrogen) and pyromellitic dianhydride (or a derivative thereof), in the presence of a Lewis acid (for example, $AlCl_3$), to form substituted bis(benzoyl) phthalic acids via a Friedel-Crafts reaction; (2) reducing the substituted bis(benzoyl)phthalic acids to give the corresponding substituted bis(benzyl)phthalic acids; (3) cyclizing the substituted bis(benzyl)phthalic acids to give the corresponding substituted pentacenediones; (4) reducing the substituted pentacenediones to give the corresponding substituted pentacenediols; and (5) dehydrating the substituted pentacenediols to form the corresponding substituted pentacenes. As used herein, the term "phthalic acid" refers to terephthalic acid (1,4-benzenedicarboxylic acid), isophthalic acid (1,3-benzenedicarboxylic acid), and combinations thereof.

The step of combining at least one substituted benzene with pyromellitic dianhydride (benzene-1,2,4,5-tetracarboxylic acid dianhydride) or a derivative thereof (for example, dimethyl 2,5-bis(chlorocarbonyl)terephthalate) to form substituted bis(benzoyl)phthalic acids can be represented by the following general scheme:

Reaction Scheme A

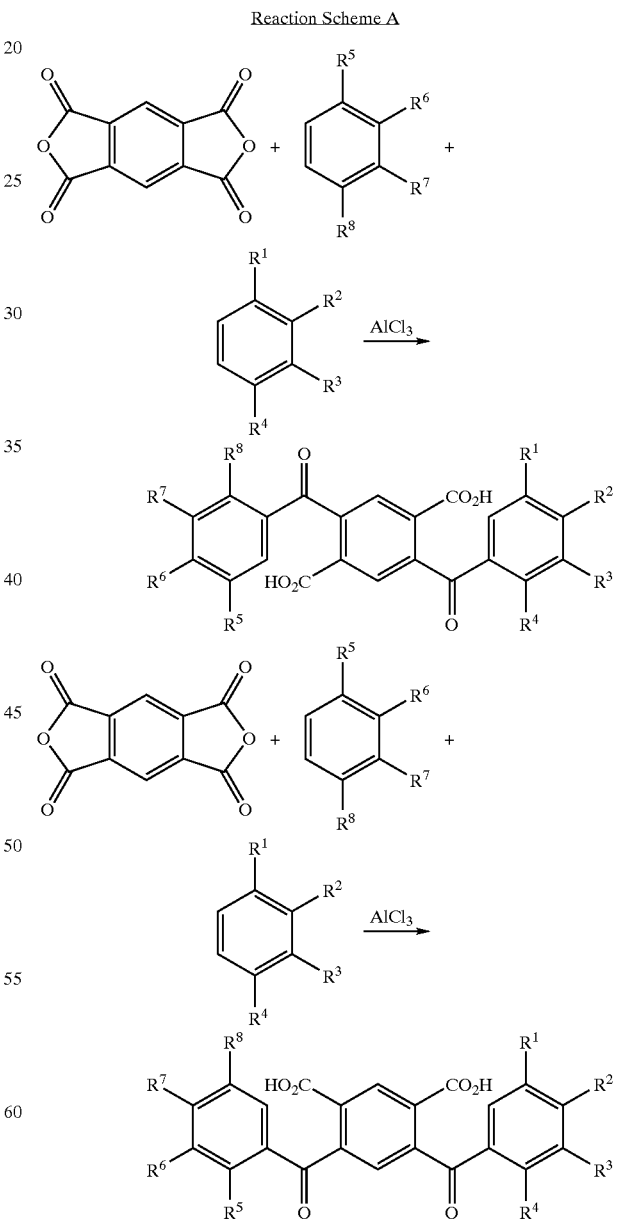

wherein each R (that is, each of the groups $R^1$ through $R^8$) is independently selected from the group consisting of electron-donating groups, halogen atoms, hydrogen atoms, and combinations thereof. Preferably, each R is independently selected from alkyl groups, alkoxy groups, thioalkoxy groups, halogen atoms, hydrogen atoms, and combinations thereof. More preferably, each R is independently selected from alkyl groups, alkoxy groups, hydrogen atoms, and combinations thereof. Even more preferably, each R is independently an alkyl group or a hydrogen atom. Most preferably, each R is independently methyl, n-hexyl, n-nonyl, n-dodecyl, n-octadecyl, sec-butyl, 3,5,5-trimethylhexyl, 2-ethylhexyl, or a hydrogen atom. Preferably, $R^2$ and $R^6$ (or $R^2$ and $R^7$) are moieties other than hydrogen while hydrogen comprises the balance of the R groups. In addition, $R^2$ and $R^6$ preferably are moieties other than hydrogen for the substituted bis(benzoyl)terephthalic acid and $R^2$ and $R^7$ preferably are moieties other than hydrogen for the substituted bis(benzoyl)isophthalic acid.

Reactions of this type (electrophilic aromatic substitution reactions) are known and have been described, for example, by Diesbach and Schmidt in Helv. Chim. Acta 7, 648 (1924); by Mills and Mills in *J. Chem. Soc.* 101, 2200 (1912); by Philippi in Monatshefte fuer Chemie 32, 634 (1911); by Philippi and Seka in Monatshefte fuer Chemie 43, 615 (1922); by Philippi and Auslaender in Monatshefte fuer Chemie 42, 1 (1921); and by Machek in Monatshefte fuer Chemie 56, 130 (1930). Preferably, the reaction is carried out in the presence of an inert solvent and an amine base in order to keep the reaction mixture fluid and to decrease the amount of rearrangement of the substituents on the aromatic ring during the reaction. Examples of useful inert solvents include 1,2-dichloroethane, dichlorobenzene, dichloromethane, carbon disulfide, nitrobenzene, and nitromethane. Examples of useful amine bases include tertiary amines such as triethylamine, diisopropylethylamine, and 1,4-diazabicyclo[2.2.2]octane (DABCO). If desired, the reaction mixture can be agitated and/or heated.

Representative examples of substituted benzenes that can be used to prepare the substituted bis(benzoyl)phthalic acids include mono- and dialkoxybenzenes; mono- and dithioalkoxybenzenes; mono- and dihalobenzenes; and mono-, di-, tri-, and tetraalkylbenzenes (for example, toluene, hexylbenzene, nonylbenzene, dodecylbenzene, sec-butylbenzene, p-xylene, 1,2,3,4-tetrahydronaphthalene, 3,5,5-trimethylhexylbenzene, 2-ethylhexylbenzene, and 1,2,3,4-tetramethylbenzene).

Alternatively, the substituted bis(benzoyl)phthalic acids can be prepared by reaction of pyromellitic dianhydride or a derivative thereof with a substituted aromatic organometallic reagent (for example, an aryl magnesium halide or an aryl lithium compound).

The resulting substituted bis(benzoyl)phthalic acids can be reduced to the corresponding substituted bis(benzyl) phthalic acids via reduction methods known in the art. For example, the reduction can be accomplished by using either zinc and aqueous ammonium hydroxide (preferably, with agitation) or catalytic hydrogenation with, for example, palladium or platinum on carbon at, for example, about 2 to 3 atmospheres (preferably, by catalytic hydrogenation; more preferably, by catalytic hydrogenation with palladium on carbon) as shown, for example, below:

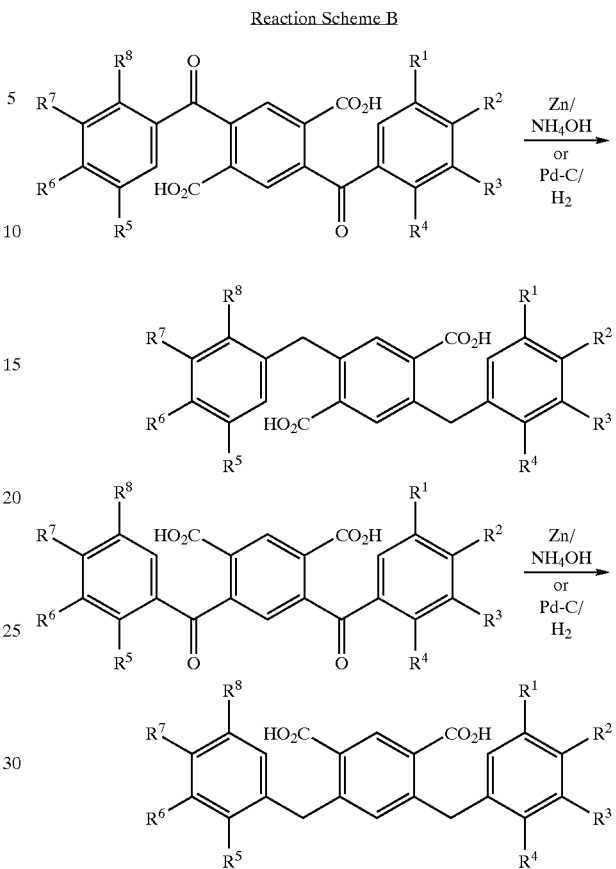

Reaction Scheme B wherein each R (that is, each of the groups $R^1$ through $R^8$) is as defined above for Scheme A. If desired, the substituted bis(benzoyl)terephthalic acids can be separated from the substituted bis(benzoyl)isophthalic acids by methods commonly used in the art (for example, by recrystallization, trituration, or chromatography) before the reduction reaction is carried out (or, alternatively, the resulting substituted bis(benzyl)phthalic acid isomers can be separated thereafter).

The cyclization step of the process can be accomplished via intramolecular Friedel-Crafts cyclization of the substituted bis(benzyl)phthalic acids to form the corresponding substituted pentacenediones (the substituted 7,14-dihydropentacene-5,12-diones and the substituted pentacene-5,7(12H,14H)-diones; hereinafter, the "5,12-diones" and the "5,7-diones").

The use of acid catalyzed Friedel-Crafts cyclization to form cyclic ketones is well known in the literature and has been described, for example, by Premasagar et al. in *J. Org. Chem.*, 46(14), 2974 (1981); by Allen et al. in Tetrahedron, 33(16), 2083 (1977); and by Hulin et al. in *J. Org. Chem.*, 49, 207 (1984). These reactions can generally be carried out at about 0° C. to 100° C. in the presence of a strong acid such as concentrated sulfuric acid, fuming sulfuric acid, polyphosphoric acid or anhydrous hydrofluoric acid. For example, unsubstituted bis(benzoyl)phthalic acid will form the corresponding tetrone when heated to 100° C. with concentrated sulfuric acid for several hours.

However, both substituted bis(benzoyl)phthalic acids and substituted bis(benzyl)phthalic acids are usually unreactive under these conditions. It appears that in general the intramolecular Friedel-Crafts cyclization of these substituted compounds cannot be readily accomplished with the strong acids that are typically used for this type of reaction. It has been discovered, however, that Friedel-Crafts cyclization of substituted bis(benzyl)phthalic acids to form the corresponding substituted pentacenediones can be accomplished using an acid composition comprising trifluoromethanesulfonic acid as shown, for example, below:

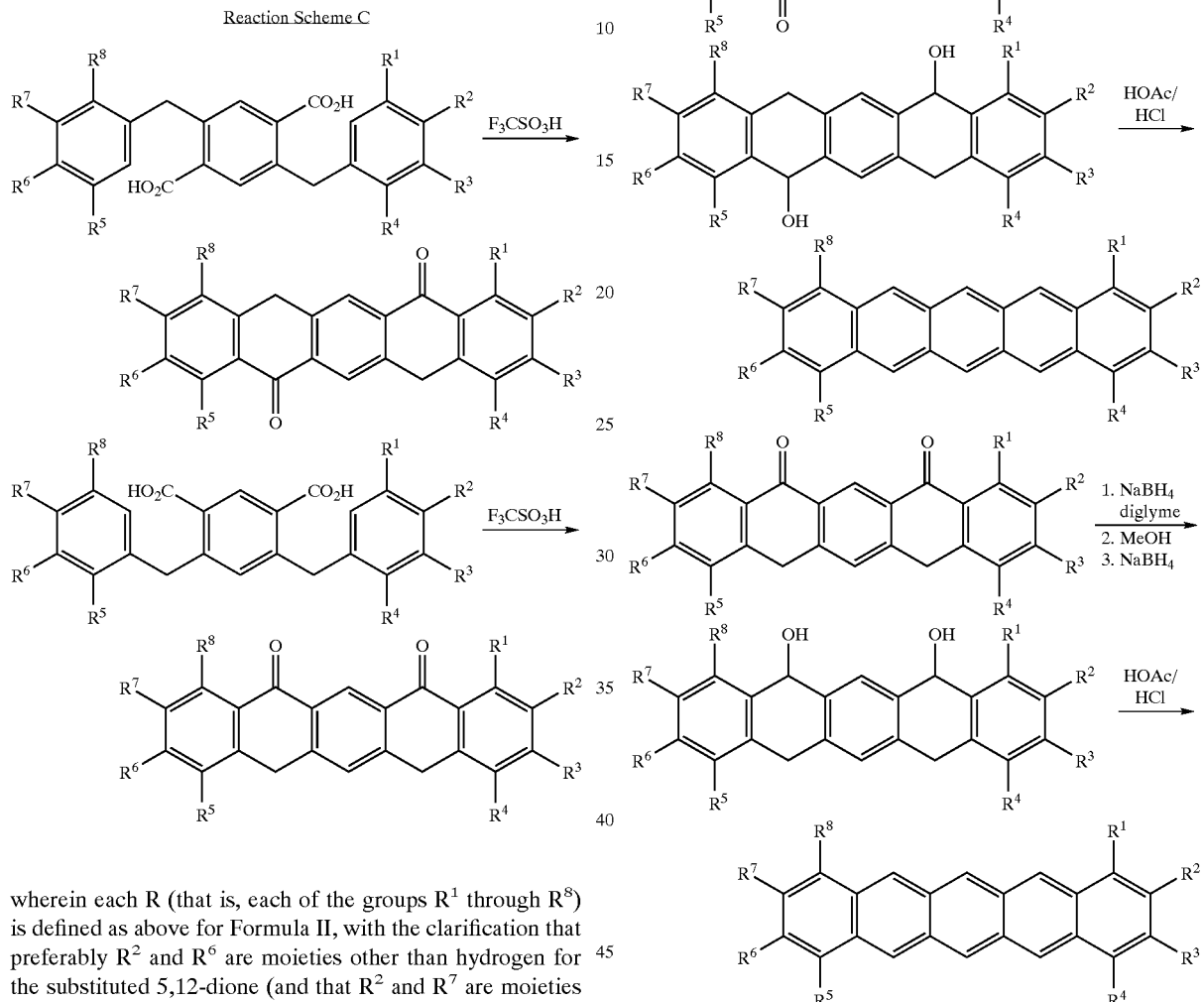

wherein each R (that is, each of the groups $R^1$ through $R^8$) is defined as above for Formula II, with the clarification that preferably $R^2$ and $R^6$ are moieties other than hydrogen for the substituted 5,12-dione (and that $R^2$ and $R^7$ are moieties other than hydrogen for the substituted 5,7-dione).

The cyclization reaction can be carried out at room temperature or, optionally, at elevated temperatures (for example, a temperature in the range of about 20° C. to 60° C.) and, preferably, with agitation of the reaction mixture. The trifluoromethanesulfonic acid can be used alone or in combination with, for example, trifluoroacetic acid, or a perfluoroalkanesulfonic acid of higher molecular weight than trifluoromethanesulfonic acid, or a neutral solvent that will not react with trifluoromethanesulfonic acid (for example, a hydrocarbon solvent, a chlorinated solvent such as methylene chloride or a fluorinated solvent) or a Lewis acid (for example, antimony pentafluoride).

The resulting substituted pentacenediones can be reduced and dehydrated to give the corresponding substituted pentacenes. Good yields can usually be obtained by, for example, a sodium borohydride reduction procedure, as shown, for example, below:

wherein each R (that is, each of the groups $R^1$ through $R^8$) is defined as above for Reaction Scheme C.

Treatment of the diones with sodium borohydride in solvent, such as alcohol(s) or ether(s) (preferably, diglyme) or a combination thereof, preferably followed by addition of methanol and then treatment with additional sodium borohydride gives the corresponding substituted diols. The diols can then be dehydrated to substituted pentacenes by treatment with an acid (for example, hydrochloric acid), preferably with application of heat (for example, heating to about 50° C. to 60° C.) and agitation. Suitable acids include, for example, acetic acid, phosphoric acid, hydrochloric acid, sulfuric acid, hydroiodic acid, hydrobromic acid, trifluoroacetic acid, and trifluoromethanesulfonic acid. Optionally, the diols can first be treated with a weak acid, such as acetic acid, followed by treatment with a stronger acid, such as hydrochloric acid.

Benzoacenes can be prepared by any known method, for example, as described in E. Clar, Polycyclic Hydrocarbons, Vol. 1, Academic Press (London and New York) and Springer-Verlag (Berlin, Gottingen and Heidelberg), 1964, which depicts 1,2-benzopentacene and 1,2:3,4-dibenzopentacene at pages 436–446.

If desired, the resulting substituted acenes can be purified one or more times by standard methods such as recrystallization, sublimation, trituration, continuous extraction, chromatography, or a combination thereof. Purification can be accomplished by sublimation, for example, using a 3-zone furnace (e.g., a Thermolyne 79500 tube furnace, available from Barnstead Thermolyne, Dubuque, Iowa) at reduced pressure under a constant flow of nitrogen gas.

The organic semiconductor layer can be provided in the OTFT of the invention by any useful means, such as for example, vapor deposition, spin coating, and printing techniques including transfer printing.

Self-Assembled Monolayer

The self-assembled monolayer (SAM) is interposed between the gate dielectric and the organic semiconductor layer. The monolayer is a product of a reaction between the gate dielectric and a precursor to the self-assembled monolayer.

Self-assembled monolayer precursors provide molecules that form a self-assembled layer, typically a monolayer, on the target surface. Self-assembled thin layers are often prepared by coating a substrate of interest in a dilute solution of the self-assembling precursor or by exposure to a vapor phase containing the precursor, and allowing layer formation to proceed. The precursor molecules form a molecular layer on the substrate with the reactive groups attached to the dielectric surface. Once formed, the layer does not redissolve in the solvent from which it was deposited.

Generally, materials that form crosslinks independently of monolayer formation that may be in competition with the adsorption or bonding reaction to the gate dielectric, such as trifunctional silanes, are not desired for the monolayer precursor of the present invention. However, materials that have functional groups effective to bond to the gate dielectric and have other groups that may form crosslinks after formation of the SAM can be used.

The monolayer precursor comprises a composition having the formula:

wherein X is H or $CH_3$;

Y is a linear or branched $C_5$–$C_{50}$ aliphatic or cyclic aliphatic connecting group, or a linear or branched $C_8$–$C_{50}$ group comprising an aromatic group and a $C_3$–$C_{44}$ aliphatic or cyclic aliphatic connecting group;

Z is selected from —$PO_3H_2$, —$OPO_3H_2$, benzotriazolyl (—$C_6H_4N_3$), benzotriazolylcarbonyloxy (—OC(=O)$C_6H_4N_3$), benzotriazolyloxy (—O—$C_6H_4N_3$), benzotriazolylamino (—NH—$C_6H_4N_3$), —CONHOH, —COOH, —OH, —SH, —COSH, —COSeH, —$C_5H_4N$, —SeH, —$SO_3H$, isonitrile (—NC), chlorodimethylsilyl (—SiCl($CH_3$)$_2$), dichloromethylsilyl (—$SiCl_2CH_3$), amino, and phosphinyl;

and n is 1, 2, or 3 provided that n=1 when Z is —SiCl($CH_3$)$_2$ or —$SiCl_2CH_3$.

Herein, the reaction between any gate dielectric and a functional group within the self-assembled monolayer precursor is preferably a bonding interaction (e.g., covalent or ionic). Herein, a self-assembled monolayer refers to a monomolecular layer on the order of about 5 Angstroms (Å) to about 30 Å thick.

In preferred embodiments, Y can be a saturated aliphatic group, an unsaturated aliphatic group, a saturated cyclic aliphatic group, and an unsaturated cyclic aliphatic group, or a combination thereof, each of which may be linear or branched.

The monolayer precursor may comprise a linear or branched phosphonoalkane having from 5 to 50 carbon atoms, more preferably 6 to 24. The monolayer precursor may comprise a composition of the formula:

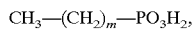

wherein m is an integer from 4 to 21.

Particular examples for the monolayer precursor include 1-phosphonooctane, 1-phosphonohexane, 1-phosphonohexadecane, and 1-phosphono-3,7,11,15-tetramethylhexadecane.

One member of a class of branched hydrocarbon monolayer precursors useful in the practice of the present invention is 1-phosphono-3,7,11,15-tetramethylhexadecane. Other members of this class include 1-phosphono-2-ethylhexane, 1-phosphono-2,4,4-trimethylpentane, and 1-phosphono-3,5,5-trimethylhexane. The 1-phosphono-3,7,11,15-tetramethylhexadecane can be prepared from a commercially available allylic alcohol precursor by reduction of the alkene double bond, conversion of the alcohol to the corresponding bromide, and then conversion of the bromide to the corresponding phosphonic acid. More specifically, 1-phosphono-3,7,11,15-tetramethylhexadecane can be obtained by reducing 3,7,11,15-tetramethyl-2-hexadecen-1-ol to 3,7,11,15-tetramethyl-1-hexadecanol, converting the 3,7,11,15-tetramethyl-1-hexadecanol to 1-bromo-3,7,11,15-tetramethylhexadecane, and then converting the 1-bromo-3,7,11,15-tetramethylhexadecane to 1-phosphono-3,7,11,15-tetramethylhexadecane. These synthetic transformations are accomplished using materials and methods familiar to those skilled in the art. Starting materials other than 3,7,11,15-tetramethyl-2-hexadecen-1-ol and individual reaction sequences other than that described above may also be used to synthesize 1-phosphono-3,7,11,15-tetramethylhexadecane, as well as other members of this class of branched hydrocarbon monolayer precursors, and the specifically exemplified monolayer precursor and method of preparation should not be construed as unduly limiting.

The self-assembled monolayer precursor is provided on the gate dielectric by any known method. For example, the precursor can be provided through a process such as spray coating, spinning, dip coating, gravure coating, microcontact printing, ink jet printing, stamping, transfer printing, and vapor deposition. The self-assembled monolayer precursor is allowed to interact with the gate dielectric surface. The interaction or reaction may be instantaneous or may require time, in which case increasing the temperature can reduce the necessary time. When a solution of the self-assembled monolayer precursor is provided on the gate dielectric layer, the solvent is removed by a method compatible with the materials involved, for example by heating. Any excess monolayer precursor is typically rinsed away before deposition of the organic semiconductor. In a preferred embodiment, the SAM is provided by the steps consisting essentially of coating the precursor, heating, and rinsing without further processing.

In one embodiment, the source and drain electrodes are provided adjacent to the gate dielectric before providing the monolayer precursor. Then, the monolayer precursor is provided. After the self-assembled monolayer is complete, the organic semiconductor layer is provided over the source and drain electrodes and over the self-assembled monolayer adjacent to the gate dielectric.

The organic thin film transistor (OTFT) of the present invention has one or more advantages over known organic thin film transistors. These advantages are apparent, for example, in charge-carrier mobility. The present invention provides OTFTs having a charge-carrier mobility better than a comparison OTFT not made according to the present invention and thus lacking the inventive self-assembled monolayer, but otherwise similar in every construction feature. The OTFT of the invention preferably has a charge-carrier mobility of at least about 25% better, more preferably at least about 50% better, and in some embodiments at least about 100% better, than the charge-carrier mobility of a comparison OTFT similar in every respect but lacking the SAM of the present invention. Such improvements in charge-carrier mobility are provided while maintaining other OTFT properties within desirable ranges. For example, the above-described improvements are obtained while providing a threshold voltage between about 25 and −25 V, a subthreshold slope below about 10 V/decade (absolute value), and an on/off ratio of at least about $10^4$.

More specifically, in an embodiment comprising a substituted pentacene as the organic semiconductor, the invention provides an OTFT with a charge-carrier mobility at least about 0.2 cm$^2$/Vs, more preferably at least 0.5 cm$^2$/Vs, and even more preferably at least about 1.0 cm$^2$/Vs. In some embodiments of the present invention, the charge-carrier mobility is above 2.0 cm$^2$/Vs.

One embodiment of the present invention provides a p-type semiconductor OTFT having a threshold voltage of between about −25 and 25 V, preferably a threshold voltage of between about 0 and −10 V, more preferably between about 0 and −5 V.

The invention provides an OTFT with a subthreshold slope below about 10 V/decade (absolute value), preferably a subthreshold slope below about 5 V/decade (absolute value), more preferably below about 2 V/decade (absolute value). The invention provides an OTFT with an on/off ratio of at least about $10^4$, preferably at least about $10^5$, more preferably at least about $5 \times 10^5$, and even more preferably at least about $10^6$.

Various combinations of these properties are possible. For example, in one embodiment of the invention, the p-type semiconductor OTFT has a charge-carrier mobility of at least about 1 cm$^2$/Vs, a negative threshold voltage, a subthreshold slope below about 5 V/decade, and an on/off ratio at least about $10^5$.

Methods of Making an OTFT

The present invention also provides a method of making a thin film transistor comprising the steps of: (a) providing a substrate; (b) providing a gate electrode material on the substrate; (c) providing a gate dielectric on the gate electrode material; (d) providing a self-assembled monolayer (SAM) adjacent to the gate dielectric, the monolayer being a product of a reaction between the gate dielectric and a precursor to the self-assembled monolayer, the precursor comprising a composition having the formula X—Y—Z$_n$, as described above; (e) applying an organic semiconductor layer as described above on the monolayer; and (f) providing a source electrode and a drain electrode contiguous to the organic semiconductor layer.

The organic semiconductor layer can be provided over or under the source and drain electrodes, as described above in reference to the thin film transistor article. The present invention also provides an integrated circuit comprising a plurality of OTFTs made by the process described above.

The present invention further provides a method of making an integrated circuit comprising providing a plurality of OTFTs as described above. Thus, the present invention is embodied in an article that comprises one or more of the OTFTs described. Such articles include, for example, radio-frequency identification tags, backplanes for active matrix displays, smart cards, memory devices, and the like. In devices containing the OTFTs of the present invention, such OTFTs are operatively connected by means known in the art.

The entire process of making the thin film transistor or integrated circuit of the present invention can be carried out below a maximum substrate temperature of about 450° C., preferably below about 250° C., more preferably below about 150° C., and even more preferably below about 70° C., or even at temperatures around room temperature (about 25° C.). The temperature selection generally depends on the substrate and processing parameters known in the art, once one is armed with the knowledge of the present invention contained herein. These temperatures are well below traditional integrated circuit and semiconductor processing temperatures, which enables the use of any of a variety of relatively inexpensive substrates, such as flexible polymeric substrates. Thus, the invention enables production of relatively inexpensive integrated circuits containing organic thin film transistors with significantly improved performance.

Objects and advantages of this invention are further illustrated by the following examples, but the particular materials and amounts thereof recited in these examples, as well as other conditions and details, should not be construed to unduly limit this invention.

EXAMPLES

Test Methods

A. Film Thickness

Single wavelength ellipsometry was employed to obtain estimates of surface treatment organic film thickness. Substrate values of Psi and Delta ($\psi_s$ and $\Delta_s$) were obtained from the cleaned substrates at an angle of incidence of 70° and a wavelength of 632.8 nm using a Gaertner Dual Mode Automatic Ellipsometer, model L116A (Gaertner Co., Skokie, Ill.). The film was applied to the substrates, and film values were measured ($\psi_f$ and $\Delta_f$).

Ellipsometry modeling software, WVASE32 (from J. A. Woollam, Inc., Lincoln, Nebr.) was used to construct an optical model consisting of 1500 Å Al$_2$O$_3$ on 10 Å SiO$_2$ on Si. Typical optical constants (included with the software) were employed for the SiO$_2$ and Si layers. The floating variables in the fit were the thickness (d) and refractive index (n) of the Al$_2$O$_3$. Seed values of 1500 Å and n=1.77 were used. Typical final fit values were between 1400 Å and 1700 Å with n between 1.56 and 1.60.

Once $\psi_s$ and $\Delta_s$ were fit, the floating variables (d$_{Al2O3}$ and n$_{Al2O3}$) were then fixed. An organic layer was added to the optical model, between the air and dielectric layers. This layer had a variable thickness, but its refractive index was fixed at 1.46. The organic layer thickness was then varied to achieve the best fit to $\psi_f$ and $\Delta_f$. This organic layer thickness was reported as the thickness of the self-assembled monolayer.

For more information see Laibinis, et al., "Comparison of the structures and wetting properties of self-assembled monolayers of normal-alkanethiols on the coinage metal surfaces, Cu, Ag, Au", *J. Am. Chem. Soc.*, Vol. 113, pages 7152–67, 1991.

B. Thin Film Transistor Performance

Transistor performance was tested at room temperature in air using techniques known in the art, for example as shown in S. M. Sze, *Physics of Semiconductor Devices*, page 442, John Wiley & Sons, New York, 1981, which is herein incorporated by reference. A Semiconductor Parameter Analyzer (model 4145A from Hewlett-Packard, San Jose, Calif.) was used for the results below.

The square root of the drain current ($I_d$) was plotted as a function of gate-source bias ($V_g$), from +10V to −40V for a constant source-drain bias ($V_d$) of −40V, and the saturation field effect mobility was calculated from the straight line portion of the curve using the specific capacitance of the gate dielectric, the channel width and the channel length. The x-axis extrapolation of this straight-line fit was taken as the threshold voltage ($V_t$). In addition, plotting $I_d$ as a function of $V_g$ yielded a curve where a straight line fit was drawn along a portion of the curve containing $V_t$. The inverse of the slope of this line was the subthreshold slope (S). The on-off ratio was taken as the difference between the minimum and maximum current values of the $I_d$–$V_g$ curve.

Materials
Monolayer Precursor

The self-assembled monolayer precursor, 1-phosphonohexadecane ($CH_3$—$(CH_2)_{15}$—$PO_3H_2$), was commercially available from Oryza Laboratories, Chelmsford, Mass.

The phosphonic acid as received contained residual ethyl esters, so the material was purified by hydrolysis of residual ester in aqueous hydrochloric acid at 100° C. followed by recrystallization of the phosphonic acid from heptane using procedures known to those skilled in the art.

Organic Semiconductor 2,9-Dimethylpentacene was prepared as described in U.S. Ser. No. 09/966,961 filed on Sep. 27, 2001 and further purified in a gradient furnace at a maximum temperature of 300° C. and a pressure of about 0.67 MPa under a flowing gas (nitrogen with 4 volume % hydrogen, 30–35 cm³/sec). The sublimed material was collected and used without further purification.

Substrate

Single crystal <100> orientation silicon wafers were obtained from Silicon Valley Microelectronics, San Jose, Calif. with a 1500 Å layer of alumina deposited on each wafer front via chemical vapor deposition methods and a 5000 Å layer of aluminum metal vapor deposited onto the backside of each wafer. The doped wafer capped with aluminum served as the gate electrode and the aluminum oxide functioned as the gate dielectric when organic thin film transistors were prepared with this substrate material.

Example 1 and Comparative Example C1

A silicon wafer substrate described above was cleaned using a 5-minute exposure in a UV/ozone chamber (home-built, short-wavelength UV). The monolayer precursor (1-phosphonohexadecane) was then applied to the alumina surface of the substrate by spin coating a 0.1 weight percent solution of the precursor in absolute ethanol at 300 rpm for 5 seconds followed by 2000 rpm for 15 seconds. The coated substrate was then heated at 150° C. for 3 min on a vacuum hotplate, rinsed in fresh ethanol, and dried in a stream of nitrogen. The result was a self-assembled monolayer with a thickness of 19 Å (determined as described above) on the alumina layer of the substrate. A control substrate without the monolayer was prepared by treating a silicon wafer substrate described above with consecutive rinses of acetone, methanol, 2-propanol, and water, drying in a stream of nitrogen, baking on a hot plate at 100° C. for 3 minutes, and exposure to UV/ozone for 15 minutes in a chamber (home-built, short-wavelength UV).

The purified 2,9-dimethylpentacene was deposited by thermal evaporation under vacuum (approximately 1.33× $10^{-4}$ Pa with a source temperature of about 285–300° C.) onto the above self-assembled monolayer prepared surface and onto the alumina surface of the control substrate at a rate of 0.5 Å per second to reach a thickness of 600 Å as measured by a quartz crystal microbalance. Gold source and drain electrodes were then deposited through a shadow mask onto the resulting 2,9-dimethylpentacene layers by thermal evaporation in vacuum. Several hundred organic thin film transistors (OTFTs) without (Comparative Example C1) and with the self-assembled monolayer were prepared in this manner with channel lengths of 30–70 µm and widths of 1000 µm.

A representative sampling of 6 OTFTs with the self-assembled monolayer and 4 OTFTs without the monolayer were tested as described above for device performance. The averaged results appear below in Table 1.

TABLE 1

| | OTFT Performance | | | |
|---|---|---|---|---|
| Example | Mobility (cm²/Vs) | Threshold Voltage (V) | Subthreshold Slope (V/decade) | On/Off Current Ratio |
| 1 | 2.48 | −3.80 | 1.92 | 1.97 × 10⁶ |
| C1 | 1.11 | −3.55 | 1.23 | 1.31 × 10⁶ |

The results in Table 1 show that the presence of the self-assembled monolayer at the surface upon which the 2,9-dimethylpentacene layer was formed significantly increased the charge carrier mobility of the resulting OTFTs compared with OTFTs without the monolayer (Comparative Example C1).

Various modifications and alterations of this invention will become apparent to those skilled in the art without departing from the scope and principles of this invention, and it should be understood that this invention is not to be unduly limited to the illustrative embodiments set forth hereinabove. All publications and patents are herein incorporated by reference to the same extent as if each individual publication or patent was specifically and individually indicated to be incorporated by reference.

We claim:

1. An organic thin film transistor (OTFT) comprising a self-assembled monolayer interposed between a gate dielectric and an organic semiconductor layer, the monolayer being a product of a reaction between the gate dielectric and a precursor to the self-assembled monolayer, the precursor comprising a composition having the formula:

wherein X is H or $CH_3$; Y is a linear or branched $C_5$–$C_{50}$ aliphatic or cyclic aliphatic connecting group, or a linear or branched $C_8$–$C_{50}$ group comprising an aromatic group and a $C_{3-C44}$ aliphatic or cyclic aliphatic connecting group; Z is selected from —$PO_3H_2$, —$OPO_3H_2$, benzotriazolyl (—$C_6H_4N_3$), benzotriazolylcarbonyloxy (—OC(=O)$C_6H_4N_3$), benzotriazolyloxy (—O—$C_6H_4N_3$), benzotriazolylamino (—NH—$C_6H_4N_3$), —CONHOH, —COOH, —OH, —SH, —COSH, —COSeH, —$C_5H_4N$, —SeH, —$SO_3H$, —NC, —SiCl($CH_3$)$_2$, —$SiCl_2CH_3$, amino, and phosphinyl; and n is 1, 2, or 3 provided that n=1 when Z is —SiCl($CH_3$)$_2$ or —$SiCl_2CH_3$; and wherein the organic semiconductor layer comprises a material selected from:

an acene, substituted with at least one electron-donating group, halogen atom, or a combination thereof, or a benzo-annellated acene or polybenzo-annellated acene, which optionally is substituted with at least one electron-donating group, halogen atom, or a combination thereof.

2. The OTFT of claim 1 wherein the at least one electron-donating group is selected from an alkyl, alkoxy, or thioalkoxy, and having from 1 to 24 carbon atoms.

3. The OTFT of claim 1 having a threshold voltage between about −25 and 25 volts, a subthreshold slope below about 10 volts per decade (absolute value), an on/off ratio of at least about $10^4$, and a charge-carrier mobility improvement over a comparison OTFT of the same construction but lacking the self-assembled monolayer of at least about 25%.

4. The OTFT of claim 1 wherein the semiconductor layer comprises a material selected from $C_1$–$C_{24}$ alkyl-, polyalkyl-, alkoxy-, or polyalkoxy-substituted acenes.

5. The OTFT of claim 1 wherein the semiconductor layer comprises a material selected from $C_1$–$C_{24}$ alkyl-, polyalkyl-, alkoxy-, or polyalkoxy-substituted anthracene.

6. The OTFT of claim 1 wherein the semiconductor layer comprises a material selected from $C_1$–$C_{24}$ alkyl-, polyalkyl-, alkoxy-, or polyalkoxy-substituted tetracene.

7. The OTFT of claim 1 wherein the semiconductor layer comprises a material selected from $C_1$–$C_{24}$ alkyl-, polyalkyl-, alkoxy-, or polyalkoxy-substituted pentacene.

8. The OTFT of claim 1 wherein at least one electron donating group is selected from methyl, ethyl, n-propyl, isopropyl, n-butyl, sec-butyl, n-pentyl, n-hexyl, n-heptyl, 2-methylhexyl, 2-ethylhexyl, n-octyl, n-nonyl, n-decyl, n-dodecyl, n-octadecyl, or 3,5,5-trimethylhexyl.

9. The OTFT of claim 1 wherein the semiconductor comprises a material selected from 1-methylanthracene, 2-methylanthracene, 1,2-dimethylanthracene, 2,3-dimethylanthracene, 2,3,6,7-tetramethylanthracene, 1,2,3,4-tetramethylanthracene, 2-ethylanthracene, 2,6-diethylanthracene, 2-hexylanthracene, 2,6-dihexylanthracene, 1-methyltetracene, 2-methyltetracene, 2,3-dimethyltetracene, 2,8-dimethyltetracene, 2,3,9,10-tetramethylpentacene, 2-ethyltetracene, 2,8-diethylpentacene, 2,9-diethylpentacene, 2-hexyltetracene, 2-nonyltetracene, 1-methylpentacene, 2-methylpentacene, a 2,6-dialkylanthracene, a 2,8-dialkyltetracene, a 2,3-dialkylpentacene, a 2,9-dialkylpentacene, a 2,10-dialkylpentacene, 2-ethylpentacene, 2,10-dialkoxypentacenes, 2,3,9,10-tetraalkylpentacenes, 1,4,8,11-tetraalkoxypentacenes, or 1,2,3,4,8,9,10,11-octaalkylpentacenes, dibenzo[de,qr]tetracene, zethrene, dibenzo pentacene, and dibenzo pentacene; wherein said alkyl or alkoxy group in each formula has from 1 to 24 carbons.

10. The OTFT of claim 1 wherein the semiconductor comprises a material selected from 2,3-dimethylpentacene, 2,9-dimethylpentacene, 2,10-dimethylpentacene, 2,10-dimethoxypentacene, 2,3,9,10-tetramethylpentacene, 1,4,8,11-tetramethoxypentacene, or 1,2,3,4,8,9,10,11-octamethylpentacene.

11. An organic thin film transistor (OTFT) comprising a self-assembled monolayer interposed between a gate dielectric and an organic semiconductor layer, the monolayer being a product of a reaction between the gate dielectric and a precursor to the self-assembled monolayer, the precursor comprising a composition having the formula:

X—Y—Z$_n$, wherein X is H or $CH_3$; Y is a linear or branched $C_5$–$C_{50}$ aliphatic or cyclic aliphatic connecting group, or a linear or branched $C_8$–$C_{50}$ group comprising an aromatic group and a $C_{3\text{–}C44}$ aliphatic or cyclic aliphatic connecting group; Z is selected from —PO$_3$H$_2$, —OPO$_3$H$_2$, benzotriazolyl (—C$_6$H$_4$N$_3$), benzotriazolylcarbonyloxy (—OC(=O)C$_6$H$_4$N$_3$), benzotriazolyloxy (—O—C$_6$H$_4$N$_3$), benzotriazolylamino (—NH—C$_6$H$_4$N$_3$), —CONHOH, —COOH, —OH, —SH, —COSeH, —C$_5$H$_4$N, —SeH, —SO$_3$H, —NC, —SiCl(CH$_3$)$_2$, —SiCl$_2$CH$_3$, amino, and phosphinyl; and n is 1, 2, or 3 provided that n=1 when Z is —SiCl(CH$_3$)$_2$ or —SiCl$_2$CH$_3$; and wherein the organic semiconductor layer comprises a semiconductor of the formula:

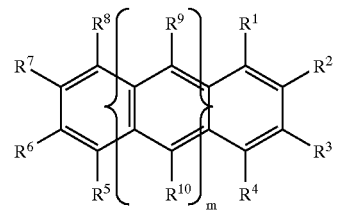

wherein each R group is independently selected from electron-donating groups, halogen atoms, hydrogen atoms, and combinations thereof, provided that not all R groups are hydrogen; m is 1, 2, 3, or 4; each $R^9$ and $R^{10}$ is independently H or any R group; and any combination of two adjacent R groups may together form a five or six carbon cyclic aliphatic or aromatic group;

provided that neither $R^2$ with $R^3$ nor $R^6$ with $R^7$ form part of a six-member aromatic ring; and provided that when m is 1 neither $R^9$ nor $R^{10}$ form part of a six-member aromatic ring.

12. The OTFT of claim 11 wherein Y is selected from a saturated aliphatic group, an unsaturated aliphatic group, a saturated cyclic aliphatic group, and an unsaturated cyclic aliphatic group, or a combination thereof, each of which may be linear or branched.

13. The OTFT of claim 11 wherein the monolayer precursor comprises a composition selected from 1-phosphonohexane, 1-phosphonooctane, 1-phosphonohexadecane, and 1-phosphono-3,7,11,15-tetramethylhexadecane.

14. The OTFT of claim 11 wherein the monolayer precursor comprises a composition selected from $CH_3$—$(CH_2)_m$—$PO_3H_2$, wherein m is an integer from 4 to 21.

15. The OTFT of claim 11 wherein the monolayer precursor comprises a linear or branched phosphonoalkane having from 5 to 50 carbon atoms.

16. The OTFT of claim 15 wherein the organic semiconductor layer comprises a pentacene substituted with at least one alkyl or alkoxy group having from 1 to 24 carbons.

17. The OTFT of claim 16 wherein the pentacene has the structure:

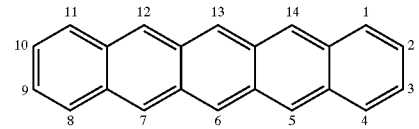

and is substituted at one or more of the 1, 2, 3, 4, 8, 9, 10, and 11 positions.

18. The OTFT of claim 17 wherein the semiconductor is selected from a 2,3-, 2,9-, or 2,10-dialkyl- or dialkoxysubstituted pentacene wherein each alkyl or alkoxy group independently has from 1 to 24 carbons, or a 2,3,9,10- or 1,4,8,11-tetraalkyl- or tetraalkoxy-substituted pentacene wherein each alkyl or alkoxy group independently has from 1 to 24 carbons.

19. The OTFT of claim 15 wherein the organic semiconductor is selected from 2,3-, 2,9- or 2,10-dimethylpentacene.

20. An integrated circuit comprising a multiplicity of thin film transistors according to claim 1.

21. An integrated circuit comprising a multiplicity of the thin film transistors of claim 1 on a non-participating substrate, which optionally is flexible.

22. A method of making an organic thin film transistor of claim 1 comprising:

a) providing a substrate;

b) providing a gate electrode material on the substrate;

c) providing said gate dielectric on the gate electrode material;

d) providing said self-assembled monolayer adjacent to the gate dielectric and e) applying said organic semiconductor layer on the monolayer; and f) providing a source electrode and a drain electrode contiguous to the organic semiconductor layer.

23. The method of claim 22 wherein the steps are performed in the order (a) through (f).

24. The method of claim 22 wherein an excess of the precursor is provided in step (d), followed by allowing sufficient time for interaction, and removing excess precursor.

25. The method of claim 22 wherein the substrate is flexible.

26. The method of claim 22 carried out in its entirety below a peak substrate temperature of 250° C.

27. The method of claim 22 carried out on a web.

28. An integrated circuit comprising a plurality of thin film transistors made by the method of claim 22.

* * * * *

UNITED STATES PATENT AND TRADEMARK OFFICE
CERTIFICATE OF CORRECTION

PATENT NO. : 6,768,132 B2
APPLICATION NO. : 10/094007
DATED : July 27, 2004
INVENTOR(S) : Terrance P. Smith It is certified that error appears in the above-identified patent and that said Letters Patent is hereby corrected as shown below:

Column 4,
Line 28, delete "BrØnsted" and insert -- Brønsted --, therefor.

Column 6,
Line 3, delete "Polyaziactones" and insert -- Polyazlactones --, therefor.
Line 22, delete "$R^5$-(S)-S-" and insert -- $R^5$-C(S)-S- --, therfor.

Column 10,
Line 21, delete "chlorothaneihiol" and insert -- chloroethanethiol --, therefor.
Line 25 (Approx.), delete "metcaptoacetate" and insert -- mercaptoacetate --, therefor.

Column 11,
Line 19, delete "preexisting" and insert -- pre-existing --, therefor.
Line 42, delete "4methoxy" and insert -- 4-methoxy --, therefor.

Column 12,
Line 47, delete "alkylsalphonic" and insert -- alkylsulphonic --, therefor.
Line 48, delete "2-vinyl4" and insert -- 2-vinyl-4 --, therefor.

Column 13,
Line 18 (Approx.), delete "sulfonyidiethanol" and insert -- sulfonyldiethanol --, therefor.
Line 56, delete "$M_n$," and insert -- $M_n$• --, therefor.

Column 14,
Line 15, after "Z" insert -- , --
Line 47, after "support" insert -- , --.

Column 16,
Line 14, delete "50°C" and insert -- 5°C --, therefor.

Column 17,
Line 3, delete "Bromoethyl" and insert -- Bromo-ethyl --, therefor.

Column 18,
Line 24, delete "dimethyl4H" and insert -- dimethyl-4H --, therefor.
Line 25, after "15.67g", delete "," and insert -- ; --, therefor.
Line 58, delete "4dimethyl" and insert -- 4-dimethyl --, therefor.

UNITED STATES PATENT AND TRADEMARK OFFICE
CERTIFICATE OF CORRECTION

PATENT NO. : 6,768,132 B2
APPLICATION NO. : 10/094007
DATED : July 27, 2004
INVENTOR(S) : Terrance P. Smith It is certified that error appears in the above-identified patent and that said Letters Patent is hereby corrected as shown below:

Column 19,
Line 26 (Approx.), delete "ethyl}-amino)ethyl" and insert
-- ethyl}-amino)-ethyl --, therefor.
Line 45, delete "sprayed" and insert -- sparged --, therefor.
Line 61-62 (Approx.), delete "2-yl)ethyl" and insert -- 2-yl)-ethyl --, therefor.

Column 20,
Line 1, delete "sprayed" and insert -- sparged --, therefor.
Line 21 (Approx.), "isobomyl" and insert -- isobornyl --, therefor.
Line 33, delete "lsobomyl" and insert -- lsobornyl --, therefor.

Signed and Sealed this

Twenty-third Day of January, 2007

JON W. DUDAS
*Director of the United States Patent and Trademark Office*

UNITED STATES PATENT AND TRADEMARK OFFICE
CERTIFICATE OF CORRECTION

| | |
|---|---|
| PATENT NO. | : 6,768,132 B2 |
| APPLICATION NO. | : 10/094007 |
| DATED | : July 27, 2004 |
| INVENTOR(S) | : Terrance P. Smith |

It is certified that error appears in the above-identified patent and that said Letters Patent is hereby corrected as shown below:

Title page,
Item [56], References Cited, OTHER PUBLICATIONS, after "(2002)" delete "m" and insert -- , --, therefor.
Item [56], References Cited, OTHER PUBLICATIONS, Page 2, after "Digital" delete ".".

Column 4,
Line 28, delete "BrØnsted" and insert -- Brønsted --, therefor.

Column 6,
Line 3, delete "Polyaziactones" and insert -- Polyazlactones --, therefor.
Line 22, delete "$R^5$-(S)-S-" and insert -- $R^5$-C(S)-S- --, therefor.

Column 10,
Line 21, delete "chloroethaneihiol" and insert -- chloroethanethiol --, therefor.
Line 25 (Approx.), delete "metcaptoacetate" and insert -- mercaptoacetate --, therefor.

Column 11,
Line 19, delete "preexisting" and insert -- pre-existing --, therefor.
Line 42, delete "4methoxy" and insert -- 4-methoxy --, therefor.

Column 12,
Line 47, delete "alkylsalphonic" and insert -- alkylsulphonic --, therefor.
Line 48, delete "2-vinyl4" and insert -- 2-vinyl-4 --, therefor.

Column 13,
Line 18 (Approx.), delete "sulfonyidiethanol" and insert -- sulfonyldiethanol --, therefor.
Line 56, delete "$M_n$." and insert -- $M_n$• --, therefor.

Column 14,
Line 15, after "Z" insert -- , --.
Line 47, after "support" insert -- . --.

Column 16,
Line 14, delete "50°C" and insert -- 5°C --, therefor.

Column 17,
Line 3, delete "Bromoethyl" and insert -- Bromo-ethyl --, therefor.

UNITED STATES PATENT AND TRADEMARK OFFICE
CERTIFICATE OF CORRECTION

PATENT NO. : 6,768,132 B2
APPLICATION NO. : 10/094007
DATED : July 27, 2004
INVENTOR(S) : Terrance P. Smith It is certified that error appears in the above-identified patent and that said Letters Patent is hereby corrected as shown below:

Column 18,
Line 24, Table 1, delete "1.97 x 106" and insert -- $1.97 \times 10^6$ --, therefor.
Line 24, delete "dimethyl4H" and insert -- dimethyl-4H --, therefor.
Line 25, Table 1, delete "1.31 x 106" and insert -- $1.31 \times 10^6$ --, therefor.
Line 25, after "15.67g", delete "," and insert -- ; --, therefor.
Line 58, delete "4dimethyl" and insert -- 4-dimethyl --, therefor.

Column 19,
Line 26 (Approx.), delete "ethyl}-amino)ethyl" and insert -- ethyl}-amino)-ethyl --, therefor.
Line 45, delete "sprayed" and insert -- sparged --, therefor.
Line 47, in claim 9, after "dibenzo" (first occurrence) insert -- [de,st] --.
Line 47, in claim 9, after "dibenzo" (second occurrence) insert -- [de,uv] --.
Line 61-62 (Approx.), delete "2-yl)ethyl" and insert -- 2-yl)-ethyl --, therefor.

Column 20,
Line 1, delete "sprayed" and insert -- sparged --, therefor.
Line 21 (Approx.), "isobomyl" and insert -- isobornyl --, therefor.
Line 33, delete "Isobomyl" and insert -- Isobornyl --, therefor.

Signed and Sealed this

Thirteenth Day of February, 2007

JON W. DUDAS
*Director of the United States Patent and Trademark Office*

UNITED STATES PATENT AND TRADEMARK OFFICE
CERTIFICATE OF CORRECTION

PATENT NO. : 6,768,132 B2  
APPLICATION NO. : 10/094007  
DATED : July 27, 2004  
INVENTOR(S) : Terrance P. Smith et al.

It is certified that error appears in the above-identified patent and that said Letters Patent is hereby corrected as shown below:

This certificate supersedes the Certificates of Correction issued January 23, 2007 and February 13, 2007. The certificate should be vacated since the Certificate of Correction consists of errors to be corrected that does not correspond to text in printed patent. The corrections that belongs to Patent No. 6,768,132 are as follows:

Title page,  
Item [56], References Cited, OTHER PUBLICATIONS, Chung-Kun Song reference, line 3 after "(2002)" delete "m" and insert -- , --, therefor.  
Item [56], References Cited, OTHER PUBLICATIONS, Page 2, Kane et al reference, line 1 after "Digital" delete "."

Column 18,  
Line 24, Table 1, delete "1.97 × 106" and insert -- $1.97 \times 10^6$ --, therefor.  
Line 25, Table 1, delete "1.31 × 106" and insert -- $1.31 \times 10^6$ --, therefor.

Column 19,  
Line 47, in claim 9, after "dibenzo" (first occurrence) insert -- [de,st] --.  
Line 47, in claim 9, after "dibenzo" (second occurrence) insert -- [de,uv] --.

Signed and Sealed this

Sixteenth Day of September, 2008

JON W. DUDAS  
*Director of the United States Patent and Trademark Office*